United States Patent
Chang et al.

(10) Patent No.: US 8,334,962 B2
(45) Date of Patent: Dec. 18, 2012

(54) GATE-IN-PANEL TYPE LIQUID CRYSTAL DISPLAY DEVICE WITH SHORTAGE-PREVENTING PATTERN AND METHOD OF FABRICATING THE SAME

(75) Inventors: Byung-Hoon Chang, Gumi-si (KR); Min-Jung Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 640 days.

(21) Appl. No.: 12/461,164

(22) Filed: Aug. 3, 2009

(65) Prior Publication Data
US 2009/0290085 A1 Nov. 26, 2009

Related U.S. Application Data

(62) Division of application No. 11/453,082, filed on Jun. 15, 2006, now Pat. No. 7,583,350.

(30) Foreign Application Priority Data

Nov. 30, 2005 (KR) .............................. 2005-115385

(51) Int. Cl.
G02F 1/1345 (2006.01)
G02F 1/136 (2006.01)
G02F 1/1339 (2006.01)
G02F 1/13 (2006.01)

(52) U.S. Cl. .......... 349/152; 349/52; 349/149; 349/153; 349/155; 349/190

(58) Field of Classification Search .................... 349/54, 349/192, 149–152
See application file for complete search history.

(56) References Cited

U.S. PATENT DOCUMENTS

| 6,392,719 | B2 | 5/2002 | Kim | |
|---|---|---|---|---|
| 6,466,294 | B1 | 10/2002 | Yamagishi et al. | |
| 6,724,448 | B2* | 4/2004 | Nakahara | 349/123 |
| 6,774,958 | B2 | 8/2004 | Kweon et al. | |
| 6,801,289 | B2* | 10/2004 | Ichioka et al. | 349/152 |
| 7,446,826 | B2* | 11/2008 | Ro et al. | 349/60 |
| 2003/0112387 | A1* | 6/2003 | Lim | 349/110 |

FOREIGN PATENT DOCUMENTS

| JP | 07-311385 | 11/1995 |
|---|---|---|
| JP | 2002-196697 | 7/2002 |

* cited by examiner

Primary Examiner — Hoan C Nguyen
(74) Attorney, Agent, or Firm — McKenna, Long and Aldridge, LLP.

(57) ABSTRACT

A liquid crystal display device comprises: a first substrate and a second substrate facing and spaced apart from each other, the first substrate and the second substrate including an active area, a signal input area and a pad area, the signal input area and the pad area being disposed at a periphery of the active area; a gate line and a data line on the first substrate in the active area, the gate line and the data line crossing each other; first connection lines and second connection lines in the signal input area, the first connection lines extending to the pad area and crossing the second connection lines; a gate connection pattern contacting the first connection lines and the second connection lines; a common electrode on the second substrate; a shortage-preventing pattern on the common electrode and corresponding to the gate connection pattern; a seal pattern surrounding the active area, the seal pattern including a conductive ball; and a liquid crystal layer between the first and second substrates in the seal pattern.

14 Claims, 8 Drawing Sheets

US 8,334,962 B2

GATE-IN-PANEL TYPE LIQUID CRYSTAL DISPLAY DEVICE WITH SHORTAGE-PREVENTING PATTERN AND METHOD OF FABRICATING THE SAME

This application is a divisional of U.S. patent application Ser. No. 11/453,082, filed Jun. 15, 2006 now U.S. Pat. No. 7,583,350, which claims the benefit of Korean Patent Application No. 2005-0115385, filed on Nov. 30, 2005, all of which are hereby incorporated by reference for all purposes as if fully set forth herein.

BACKGROUND OF THE INVENTION

1. Field of the Invention

The present invention relates to a liquid crystal display (LCD) device. More particularly, the present invention relates to a gate-in-panel (GIP) type liquid crystal display (LCD) device and a method of fabricating the same.

2. Discussion of the Related Art

As the information age progresses, display devices for displaying information are actively being developed. More particularly, flat panel display (FPD) devices that are thin, light weight, and do not consume much power are actively being pursued. Among the various types of FPD devices, liquid crystal display (LCD) devices are widely used as monitors for notebook computers and desktop computers because of their high resolution, color rendering capability and superiority in displaying moving images.

The LCD device displays images by controlling light transmittance through the device. More particularly, liquid crystal molecules interposed between two substrates that face each other, control light transmission in response to an electric field generated between respective electrodes on the two substrates.

The LCD device may include a liquid crystal panel having two substrates and a liquid crystal layer between the two substrates, a backlight unit under the liquid crystal panel and a driving circuit unit outside the liquid crystal panel. The driving circuit unit may be formed on a printed circuit board (PCB). The PCB may be classified into a gate PCB and a data PCB connected to a gate line and a data line of the liquid crystal panel, respectively. The gate PCB and the data PCB are disposed at sides of the liquid crystal panel. The gate PCB as a tape carrier package (TCP) is connected to a gate pad portion at one end of the gate line, and the data PCB as a TCP is connected to a data pad portion at one end of the data line. For example, the gate PCB and the data PCB may be disposed at a left side and a top side of the liquid crystal panel, respectively.

When the gate PCB and the data PCB are connected to the gate pad portion and the data pad portion, the LCD device is large and heavy. To reduce size and weight of the LCD device, a gate-in-panel (GIP) type LCD device including a single PCB including a driving unit has been suggested.

FIG. 1 is a schematic plane view showing a gate-in-panel type liquid crystal display device according to the related art, and FIG. 2 is a schematic cross-sectional view taken along a line "II-II" of FIG. 1. In FIGS. 1 and 2, a gate-in-panel (GIP) type liquid crystal display (LCD) device 1 includes an array substrate 10, a color filter substrate 50 and a liquid crystal layer 70 between the array substrate 10 and the color filter substrate 50. The array substrate 10 includes an active area "AA" displaying images, a pad area "PA" at an upper portion of the active area "AA," a gate circuit area "GCA" at a side portion of the active area "AA" and a signal input area "SIA" outside of the gate circuit area "GCA."

A gate line 13 and a data line 28 cross each other to define a pixel region "P" and are formed in the active area "AA" on the array substrate 10. A gate insulating layer 21 is interposed between the gate line 13 and the data line 28. In addition, a thin film transistor (TFT) "Tr" is connected to the gate line 13 and the data line 28, and a pixel electrode 43 in the pixel region "P" is connected to the TFT "Tr." A data pad 46 connected to the data line 28 and a gate pad 47 connected to a first connection line 18 in the signal input area "SIA" are formed in the pad area "PA." Even though not shown in FIG. 1, a driving circuit unit as a tape carrier package (TCP) may be connected to the pad area "PA." A plurality of circuit blocks 48 each including switching elements and capacitors are formed in the gate circuit area "GCA." Each circuit block 48 is connected to the gate line 13 in the active area "AA" and a plurality of second connection lines 35 in the signal input area "SIA." As a result, a plurality of first connection lines 18 and the plurality of second connection lines 35 are formed in the signal input area "SIA." The plurality of first connection lines 18 extend to the pad area "PA," and the plurality of second connection lines 35 cross the plurality of first lines 18. The plurality of second connection lines 35 are connected to the plurality of circuit blocks 48 in the gate circuit area "GCA."

A black matrix 53 for preventing light leakage is formed on the color filter substrate 50. The black matrix 53 may cover a border line of the pixel region "P" and a boundary of the color filter substrate 50. A color filter layer 58 including red, green and blue color filters 58a, 58b and 58c is formed on the black matrix 53. The color filter layer 58 corresponds to the active area "AA," and the red, green and blue color filters 58a, 58b and 58c are alternately disposed in the pixel region "P." A common electrode 60 of a transparent conductive material is formed on the color filter layer 58.

Since the GIP type LCD device 1 includes the single TCP (not shown) instead of two TCPs such as a gate TCP and a data TCP, the array substrate 10 includes the gate circuit area "GCA" and the signal input area "SIA" instead of a gate pad area. In addition, the plurality of first connection lines 18 in the signal input area "SIA" extend to the pad area "PA" and are connected to the gate pad 47 in the pad area "PA." As a result, the single TCP is attached to the gate pad 47 and the data pad 46 in the pad area "PA" and external signals are input to the GIP type LCD device 1 through the gate pad 47 and the data pad 46.

The gate insulating layer 21 is interposed between the first connection lines 18 and the second connection lines 35. A passivation layer 38 is formed on the data line 28 and the plurality of second connection lines 35. The passivation layer 38 may include a first contact hole 42 exposing both the first connection lines 18 and the second connection lines 35 in the signal input area "SIA." A gate connection pattern 44 on the passivation layer 38 contacts the first connection lines 18 and the second connection lines 35 through the first contact hole 42. The first connection lines 18 and the second connection lines 35 are electrically connected to each other through the gate connection pattern 44. As a result, a plurality of gate connection patterns 44 are formed on the passivation layer 38 in the signal input area "SIA" to contact the plurality of first connection lines 18 and the plurality of second connection lines 35.

A seal pattern 80 is formed at a boundary portion outside the active area "AA," and the array substrate 10 and the color filter substrate 50 are attached to each other. The seal pattern 80 is formed of a sealant including a conductive ball 75 to apply a common voltage to the common electrode 60 of the color filter substrate 50. A common line (not shown) supplied with a common voltage from the driving circuit unit is formed at the boundary portion of the array substrate 10. Since the seal pattern 80 having the conductive ball 75 contacts the common line, a common voltage may be applied to the common electrode 60 of the color filter substrate 50 through the conductive ball 75. However, since the plurality of gate connection patterns 44 of the array substrate 10 and the common electrode 60 of the color filter substrate 50 are exposed to the seal pattern 80, the common electrode 60 can be electrically connected to the plurality of gate connection patterns 44 through the conductive ball 75 of the seal pattern 80. Accordingly, the common line 60 and the plurality of circuit blocks 48 can be electrically shorted, and the GIP type LCD device 1 does not operate normally.

SUMMARY OF THE INVENTION

Accordingly, the present invention is directed to a gate-in-panel type liquid crystal display device and method of fabricating the same that substantially obviates one or more of the problems due to limitations and disadvantages of the related art.

An advantage of the present invention is to provide a gate-in-panel type liquid crystal display device and a method of fabricating the same in which an electrical short between a common electrode and a gate connection pattern is prevented.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device comprises: a first substrate and a second substrate facing and spaced apart from each other, the first substrate and the second substrate including an active area, a signal input area and a pad area, the signal input area and the pad area being disposed at a periphery of the active area; a gate line and a data line on the first substrate in the active area, the gate line and the data line crossing each other; first connection lines and second connection lines in the signal input area, the first connection lines extending to the pad area and crossing the second connection lines; a gate connection pattern contacting the first connection lines and the second connection lines; a common electrode on the second substrate; a shortage-preventing pattern on the common electrode and corresponding to the gate connection pattern; a seal pattern surrounding the active area, the seal pattern including a conductive ball; and a liquid crystal layer between the first and second substrates in the seal pattern.

In another aspect of the present invention, a method of fabricating a liquid crystal display device comprising: forming first connection lines, second connection lines and a gate connection pattern on a first substrate including an active area, a signal input area and a pad area, wherein the signal input area and the pad area are disposed at a periphery of the active area, and the gate connection pattern contacting the first connection lines and the second connection lines in the signal input area; forming a common electrode on a second substrate; forming a shortage-preventing pattern on the common electrode, wherein the shortage-preventing pattern corresponds to the gate connection pattern; forming a seal pattern surrounding the active area, the seal pattern including a conductive ball; attaching the first and second substrates such that the shortage-preventing pattern faces the gate connection pattern; and forming a liquid crystal layer between the first and second substrates in the seal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, an example of which is illustrated in the accompanying drawings.

Figure 1:
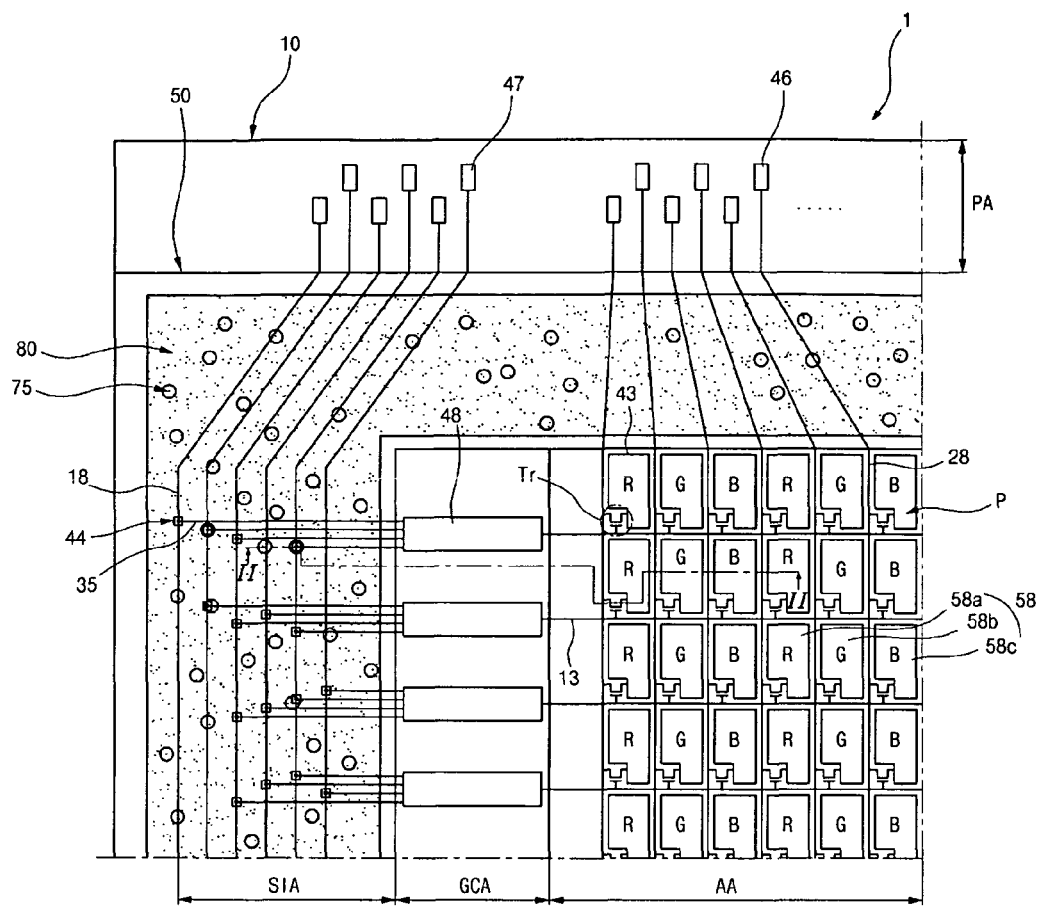
FIG. 1 is a schematic plane view showing a gate-in-panel type liquid crystal display device according to the related art.
Figure 2:
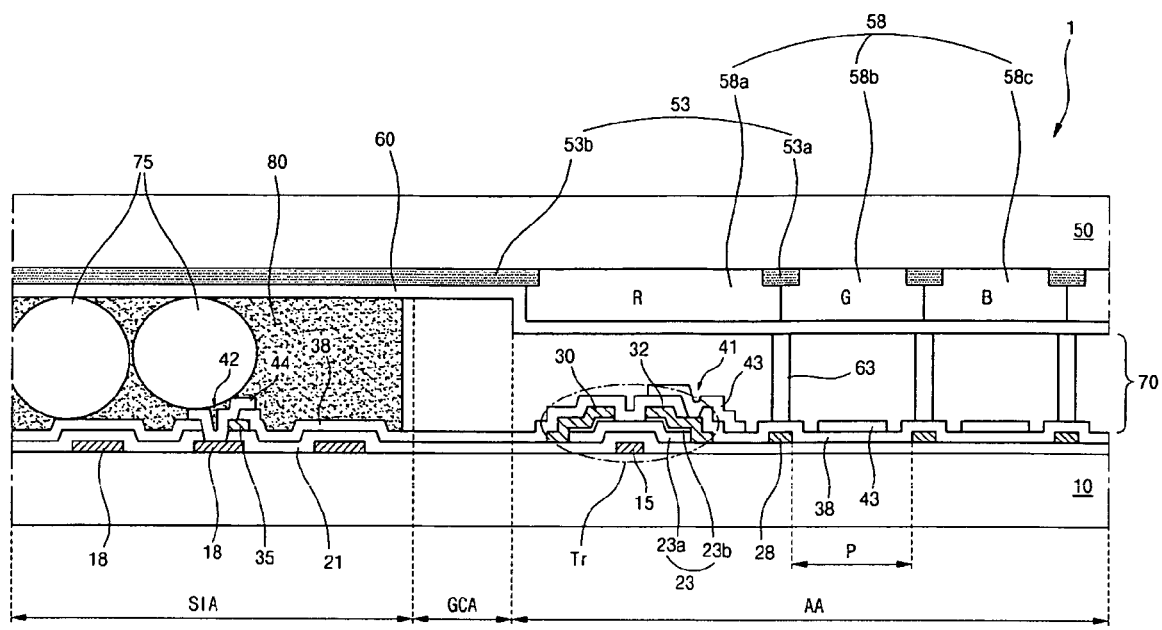
FIG. 2 is a schematic cross-sectional view taken along a line "II-II" of FIG. 1.
Figure 3:
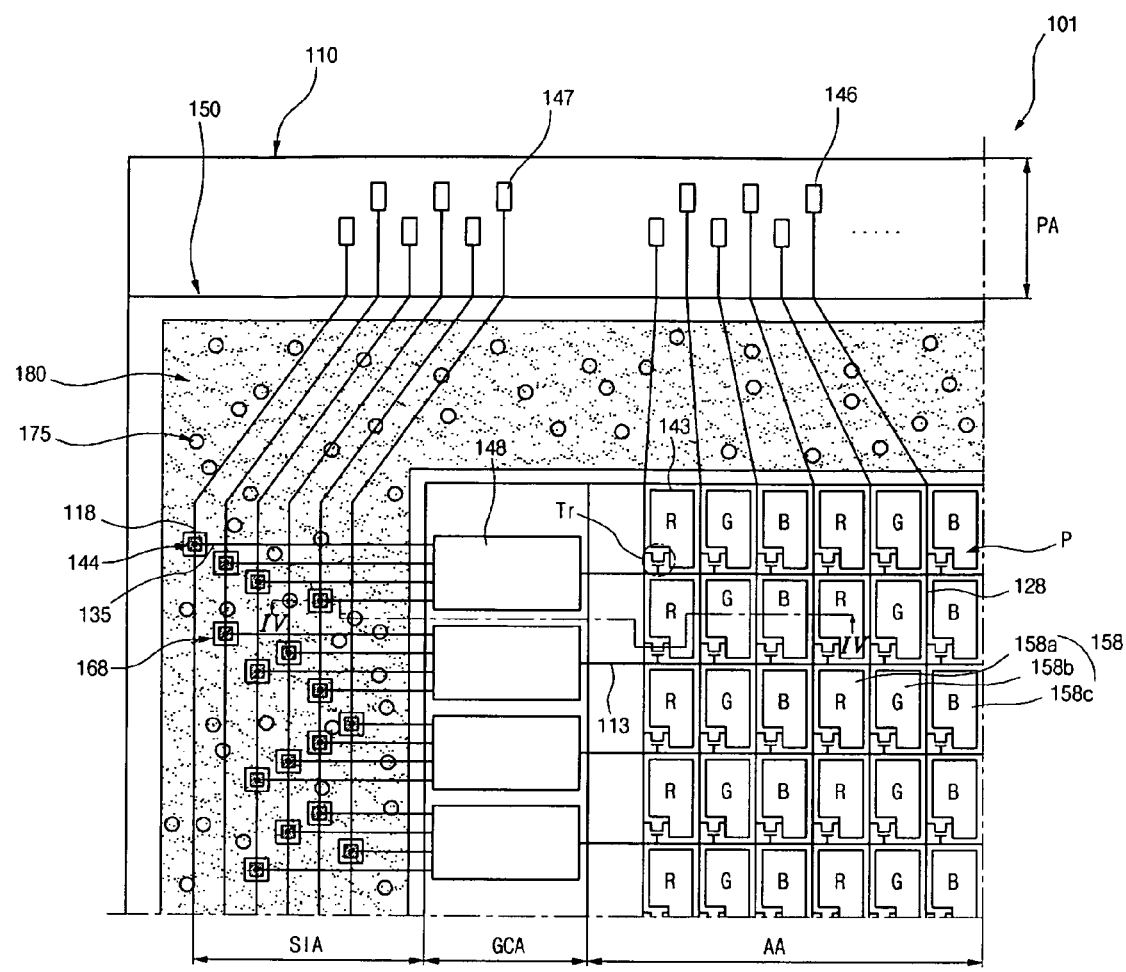
FIG. 3 is a schematic plane view showing a gate-in-panel type liquid crystal display device according to an embodiment of the present invention.
Figure 4:
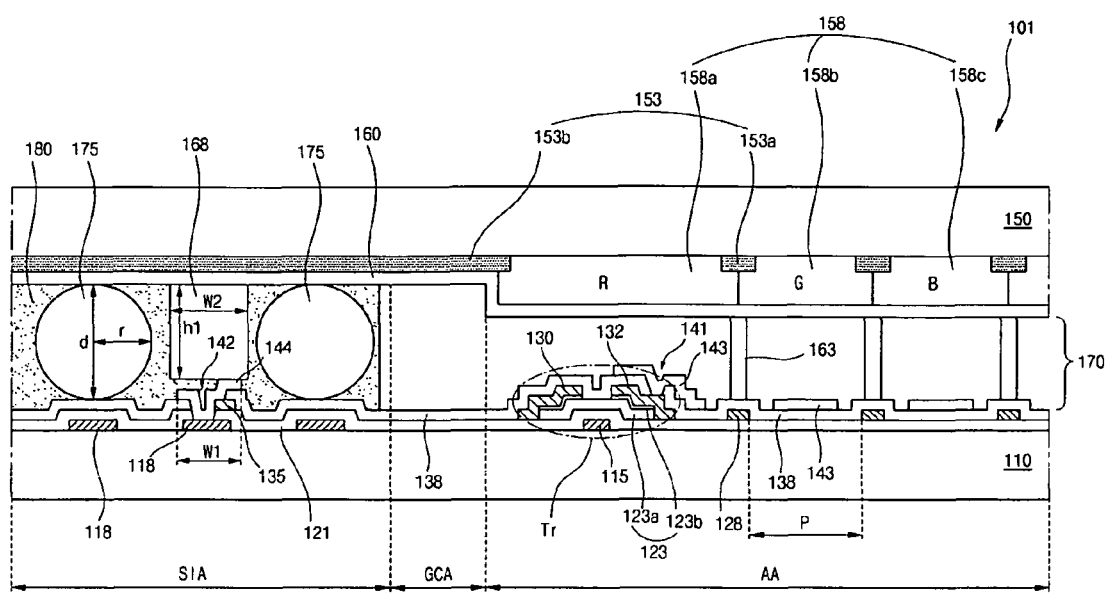
FIG. 4 is a schematic cross-sectional view taken along a line "IV-IV"

FIG. 3 is a schematic plane view showing a gate-in-panel type liquid crystal display device according to an embodiment of the present invention, and FIG. 4 is a schematic cross-sectional view taken along a line "IV-IV."

A gate-in-panel (GIP) type liquid crystal display (LCD) device 101 includes a first substrate 110, a second substrate 150 and a liquid crystal layer 170 interposed between the first and second substrates 110 and 150 respectively. The first and second substrates 110 and 150 are facing and spaced apart from each other and include an active area "AA" for displaying images, a gate circuit area "GCA" at one side of the active area "AA," a signal input area "SIA" outside the gate circuit area "GCA" and a pad area "PA" at the other side of the active area "AA." A gate line 113 and a data line 128 crossing each other to define a pixel region "P" are formed in the active area "AA" on an inner surface of the first substrate 110. A thin film transistor (TFT) "Tr" including a gate electrode 115, a gate insulating layer 121, a semiconductor layer 123, a source electrode 130 and a drain electrode 132 is connected to the gate line 113 and the data line 128. A pixel electrode 143 connected to the drain electrode 132 is formed in the pixel region "P." A data pad 146 connected to the data line 128 and a gate pad 147 connected to first connection lines 118 in the signal input area "SIA" are formed in the pad area "PA." Even though not shown in FIG. 3, a driving circuit unit that may be a tape carrier package (TCP) may be connected to the pad area "PA." A plurality of circuit blocks 148 each including switching elements such as TFTs or capacitors are formed in the gate circuit area "GCA." Each circuit block 148 is connected to the gate line 113 of the active area "AA." The plurality of circuit blocks 148 drive the gate line 113 in the active area "AA." A plurality of first connection lines 118, a plurality of second connection lines 135 and a plurality of gate connection patterns 144 are formed in the signal input area "SIA." The plurality of first connection lines 118 extend to the pad area "PA," and the plurality of second connection lines 135 are connected to the plurality of circuit blocks 148. The first connection lines 118 are electrically connected to the second connection lines 135 through the gate connection pattern 144.

A black matrix 153 for preventing light leakage is formed on an inner surface of the second substrate 150. The black matrix 153 may include a first black matrix 153a in the active area "AA" and a second black matrix 153b corresponding to a boundary portion of the active area "AA." The first black matrix 153a corresponds to the gate line 113 and the data line 118. The black matrix 153 prevents light leakage from a backlight unit (not shown) under the first substrate 110. A color filter layer 158 including red, green and blue color filters 158a, 158b and 158c is formed on the black matrix 153. The color filter layer 158 corresponds to the active area "AA," and the red, green and blue color filters 158a, 158b and 158c are alternately disposed in the pixel region "P." A common electrode 160 of a transparent conductive material is formed on the color filter layer 158.

A seal pattern 180 is formed at the boundary portion between the first substrate 110 and the second substrate 150 to prevent liquid crystal 170 leakage and to attach the first substrate 110 and the second substrate 150. The seal pattern 180 includes a conductive ball 175 having a diameter comparable to a distance between the first substrate 110 and the second substrate 150, i.e., a cell gap. A common voltage from a driving circuit is applied to a common line (not shown) on the first substrate 110 and the common electrode 160 is electrically connected to the common line through the conductive ball 175. A plurality of patterned spacers 163 are formed between the first substrate 110 and the second substrate 150 in the active area "AA." The plurality of patterned spacers 163 correspond to the gate line 113 or the data line 128 of the first substrate 110. The plurality of patterned spacers 163 keep a thickness of the liquid crystal layer 170 uniform.

In the signal input area "SIA," the plurality of first connection lines 118 are formed on the first substrate 110. The plurality of first connection lines 118 may include the same material and may be on the same layer as the gate line 113 in the active area "AA" and extend from the signal input area "SIA" to the pad area "PA" along a direction substantially parallel to the data line 128. The plurality of first connection lines 118 may be simultaneously formed with the gate line 113 through the same process. The gate insulating layer 121 is formed on the plurality of first connection lines 118. The plurality of second connection lines 135 are formed on the gate insulating layer 121 and may include the same material and may be on the same layer as the data line 128, the source electrode 130 and the drain electrode 132 in the active area "AA." The plurality of second connection lines 135 may be simultaneously formed along with the data line 128, the source electrode 130 and the drain electrode 132 through the same process. The plurality of second connection lines 135 are connected to the plurality of circuit blocks 148 in the gate circuit area "GCA" and extend along a direction parallel to the gate line 113. Accordingly, the plurality of second connection lines 135 cross the plurality of first connection lines 118.

A passivation layer 138 having a first contact hole 142 is formed on the plurality of second connection lines 135. The first contact hole 142 exposes both one end of each second connection line 135 and a portion of each first connection line 118 overlapping the one end of each second connection line 135. A plurality of gate connection patterns 144 are formed on the passivation layer 138 to cover the first contact hole 142. As a result, each gate connection pattern 144 contacts both the one end of each second connection line 135 and the portion of each first connection line 118 exposed through the first contact hole 142. The plurality of gate connection patterns 144 may include a transparent conductive material that may be formed simultaneously with the pixel electrode 143 in the active area "AA." The passivation layer 138 further includes a drain contact hole 141 exposing the drain electrode 132, and the pixel electrode 143 on the passivation layer 138 in each pixel region "P" is connected to the drain electrode 132 through the drain contact hole 141.

The second black matrix 153b is formed on the second substrate 150 in the signal input area "SIA," and the common electrode 160 is formed on the second black matrix 153b. A plurality of shortage-preventing patterns 168 are formed between the common electrode 160 and the plurality of gate connection patterns 144. The plurality of shortage-preventing patterns 168 may include the same material and may be on the same layer as the plurality of patterned spacers 163 and may correspond to the plurality of gate connection patterns 144. Each shortage-preventing pattern 168 may contact the common electrode 160 and the gate connection pattern 144 as in FIG. 4, or may contact one of the common electrode 160 and the gate connection pattern 144 and be spaced apart from the other one of the common electrode 160 and the gate connection pattern 144.

The plurality of shortage-preventing patterns 168 are formed for preventing an electrical short between the plurality of gate connection patterns 144 of the first substrate 110 and the common electrode 160 of the second substrate 150 through the conductive ball 175. Accordingly, when the conductive ball 175 having a diameter "d" comparable to the cell gap and a radius "r" of a half of the diameter "d/2" (r=d/2) is disposed in the seal pattern 180, each shortage-preventing pattern 168 having a height "h1" greater than the radius "r," i.e., the half of the diameter "d/2" may prevent the electrical short. As a result, each shortage-preventing pattern 168 may be spaced apart from one of the common electrode 160 and the gate connection pattern 144 by a distance approximately equal to or smaller than the radius "r," i.e., the half of the diameter "d/2."

In addition, each shortage-preventing pattern 168 may completely cover the gate connection pattern 144 or may be disposed inside the gate connection pattern 144. When each shortage-preventing pattern 168 is disposed inside the gate connection pattern 144 having a first width "w1," a sidewall of each shortage-preventing pattern 168 may be separated from an edge of the gate connection pattern 144 by a distance smaller than the radius "r," i.e., the half of the diameter "d/2." Accordingly, each shortage-preventing pattern 168 may have a second width "w2" equal to or greater than a value obtained by subtracting twice the radius "2r" from the first width "w1." (w2≧(w1−2r))

The plurality of shortage-preventing patterns 168 each having the height "h" and the second width "w2" prevent the conductive ball 175 from being disposed between the common electrode 160 and each gate connection pattern 144. In addition, the plurality of shortage-preventing patterns 168 may be simultaneously formed with the plurality of patterned spacers 163 in the active area "AA" through the same process to include the same material and be on the same layer as the plurality of patterned spacers 163. As a result, the plurality of shortage-preventing patterns 168 prevent an electrical contact between the conductive ball 175 and each gate connection pattern 144 without an additional process. While the shortage-preventing patterns appear as shown in the Figures, it will be appreciated that other shapes and configurations fall within the scope of the instant invention.

A fabricating method of a GIP type LCD device according to the present invention will be illustrated hereinafter. First, a fabricating method of a first substrate for a GIP type LCD device according to an embodiment of the present invention will be illustrated without figures. A gate line and a plurality of first connection lines are formed on a first substrate by depositing and patterning a first metallic material. The gate line is formed in an active area along a first direction, and the plurality of first connection lines are formed in a signal input area along a second direction crossing the first direction. The plurality of first connection lines extend to a pad area. At the same time, a first gate electrode connected to the gate line is formed in the active area and a second gate electrode is formed in a gate circuit area. A gate insulating layer is formed on the gate line, the plurality of first connection lines, the first gate electrode and the second gate electrode. A first semiconductor layer and a second semiconductor layer are formed on the gate insulating layer over the first gate electrode and the second gate electrode, respectively.

A data line is formed on the gate insulating layer in the active area by depositing and patterning a second metallic material. The data line crosses the gate line to define a pixel region. At the same time, first source and drain electrodes spaced apart from each other are formed on the first semiconductor layer, and second source and drain electrodes spaced apart from each other are formed on the second semiconductor layer. The first source electrode is connected to the data line. As a result, the first gate electrode, the first semiconductor layer, the first source electrode, and the first drain electrode constitute a first thin film transistor in the active area, and the second gate electrode, the second semiconductor layer, the second source electrode, and the second drain electrode constitute a second thin film transistor in the gate circuit area. In addition, a plurality of second connection lines are formed on the gate insulating layer in the signal input area simultaneously with the data line. The plurality of second connection lines are formed along the first direction and extend to the gate circuit area to be connected to the second thin film transistor. For example, the plurality of second connection lines may be connected to one of the second source electrode and the second drain electrode in the gate circuit area, and the second source electrode and the second drain electrode may be connected to the gate line in the active area according to a design of a plurality of circuit blocks in the gate circuit area.

A passivation layer is formed on the data line and the plurality of second connection lines. The passivation layer may include a first contact hole exposing both a portion of each first connection line and one end of each second connection line, and a drain contact hole exposing the first drain electrode. A pixel electrode and a gate connection pattern are formed on the passivation layer by depositing and patterning a transparent conductive material. The pixel electrode is connected to the first drain electrode through the drain contact hole, and the gate connection pattern is connected to both the first connection lines and the second connection lines through the first contact hole.

FIGS. 5A to 5F are schematic cross-sectional views, which are taken along a line "IV-IV" of FIG. 3, showing a fabricating method of a second substrate for a GIP type LCD device according to an embodiment of the present invention.

Figure 5A:
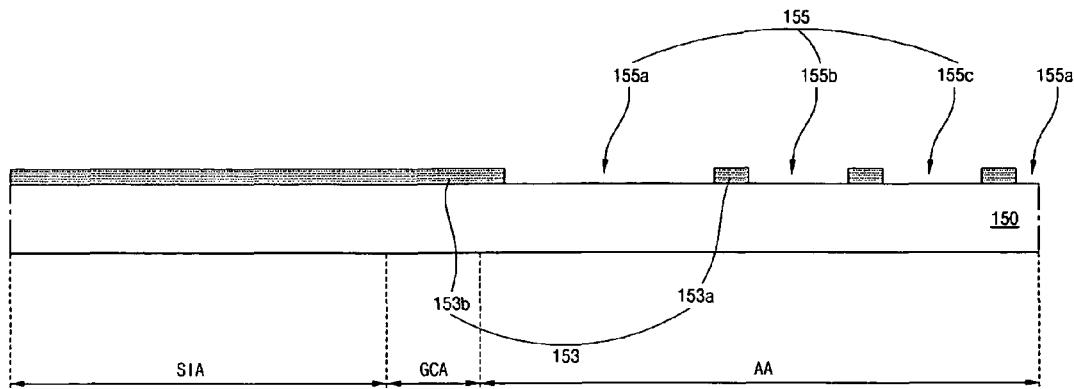
FIGS. 5A to 5F are schematic cross-sectional views, which are taken along a line "IV-IV" of FIG. 3, showing a fabricating method of a second substrate for a GIP type LCD device according to an embodiment of the present invention.

In FIG. 5A, a black matrix 153 is formed on a second substrate 150 by depositing and patterning a metallic material such as chromium (Cr) or by coating and patterning a black resin having a carbon. The black matrix 153 may include a first black matrix 153a in an active area "AA" and a second black matrix 153b in a signal input area "SIA" and a gate circuit area "GCA." The first black matrix 153a includes first, second and third openings 155a, 155b and 155c each corresponding to a pixel region "P." Even though not shown in FIG. 5A, the black matrix covers the thin film transistor (TFT), the gate line and the data line of the first substrate.

Figure 5B:
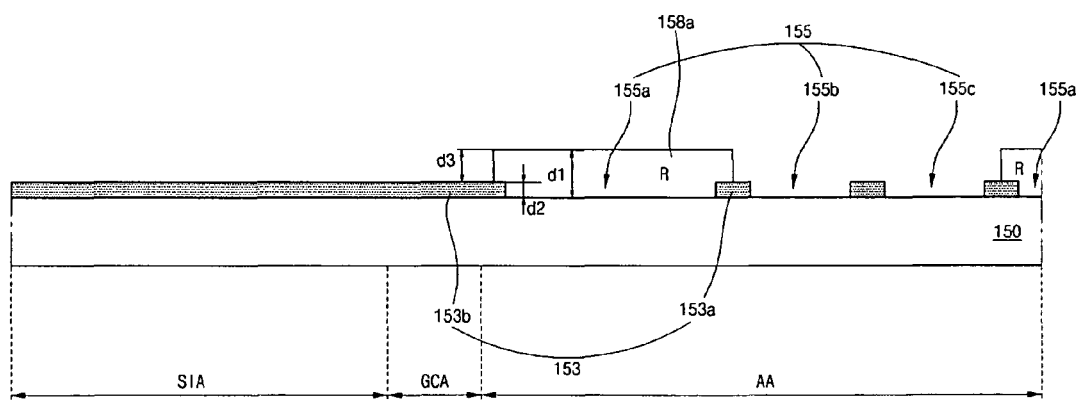

In FIG. 5B, a red color filter 158a may be formed on the black matrix 153 by coating and patterning a red resist. The red resist may be coated by a spin coating method or by a bar coating method. The coated red resist may be exposed through a mask and developed to form the red color filter 158a. The red color filter 158a may fill the first opening 155a of the black matrix 153.

Figure 5C:
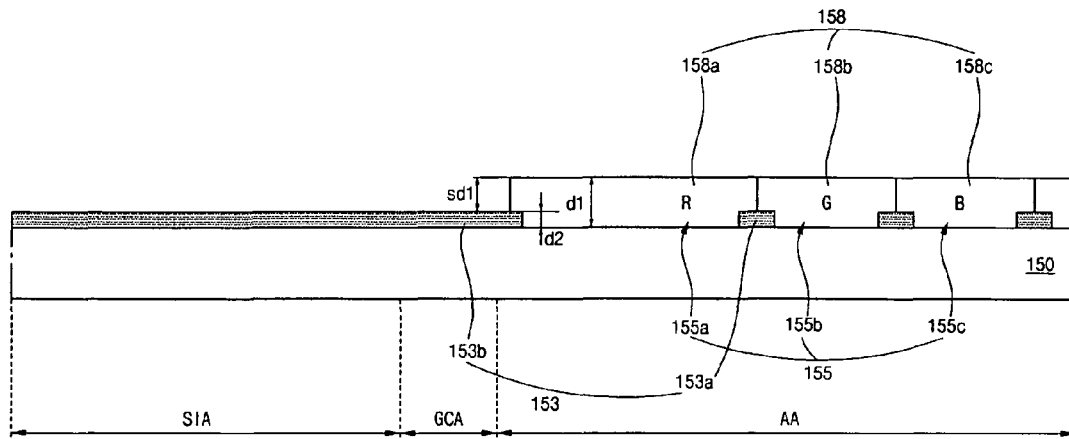

In FIG. 5C, a green color filter 158b is formed on the black matrix 153 by coating and patterning a green resist, and a blue color filter 158c is formed on the black matrix 153 by coating and patterning a blue resist. The green and blue color filters 158b and 158c fill the second and third openings 155b and 155c, respectively. As a result, a color filter layer 158 including the red, green and blue color filters 158a, 158b and 158c is formed on the second substrate 150 in the openings 155 of the black matrix 153. The color filter 158 has a first thickness "d1" and the black matrix has a second thickness "d2." The color filter layer 158 overlaps the second black matrix 153b at edge portions, and the second black matrix 153b in the signal input area "SIA" is exposed through the color filter layer 158. Accordingly, a first step difference "sd1" is generated at edge portions of the color filter layer 158 on the black matrix 153. The first step difference "sd1" may be equal to or greater than a difference "between the first and second thicknesses "d1" and "d2" (d1−d2), and equal to or smaller than the first thickness "d1." ((d1−d2)≦sd1≦d1) For example, the first thickness "d1" may be within a range of about 1.5 μm to about 3 μm. The second thickness "d2" may be equal to or smaller than about 2000 Å when the black matrix 153 includes a metallic material such as chromium (Cr), and may be equal to or smaller than about 1 μm when the black matrix 153 includes a black resin. Accordingly, the first step difference "sd1" may be within a range of about 0.5 μm to about 3 μm.

Figure 5D:
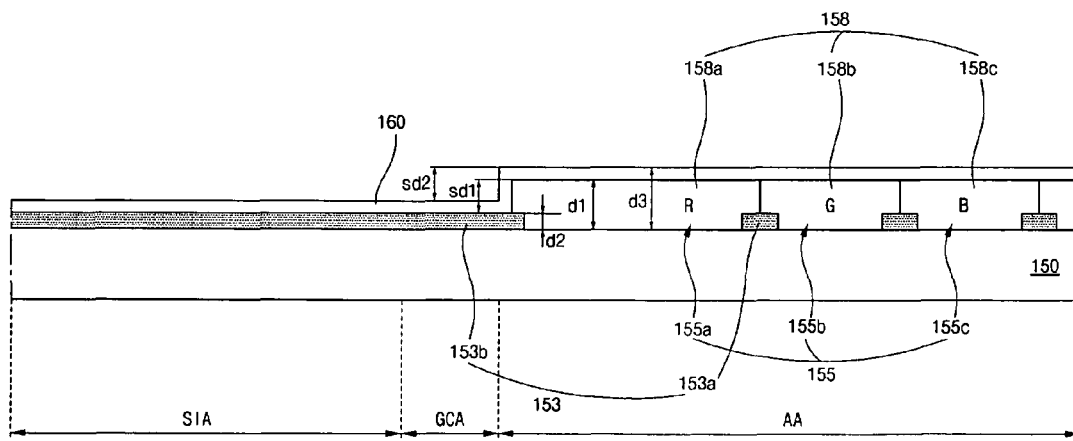

In FIG. 5D, a common electrode 160 may be formed on the color filter layer 158 by depositing and patterning a transparent conductive material such as indium-tin-oxide (ITO) and/or indium-zinc-oxide (IZO). The common electrode 160 also has a second step difference "sd2" due to the first step difference "sd1." Accordingly, the second step difference "sd2" may be within a range of about 0.5 μm to about 3 μm.

Figure 5E:
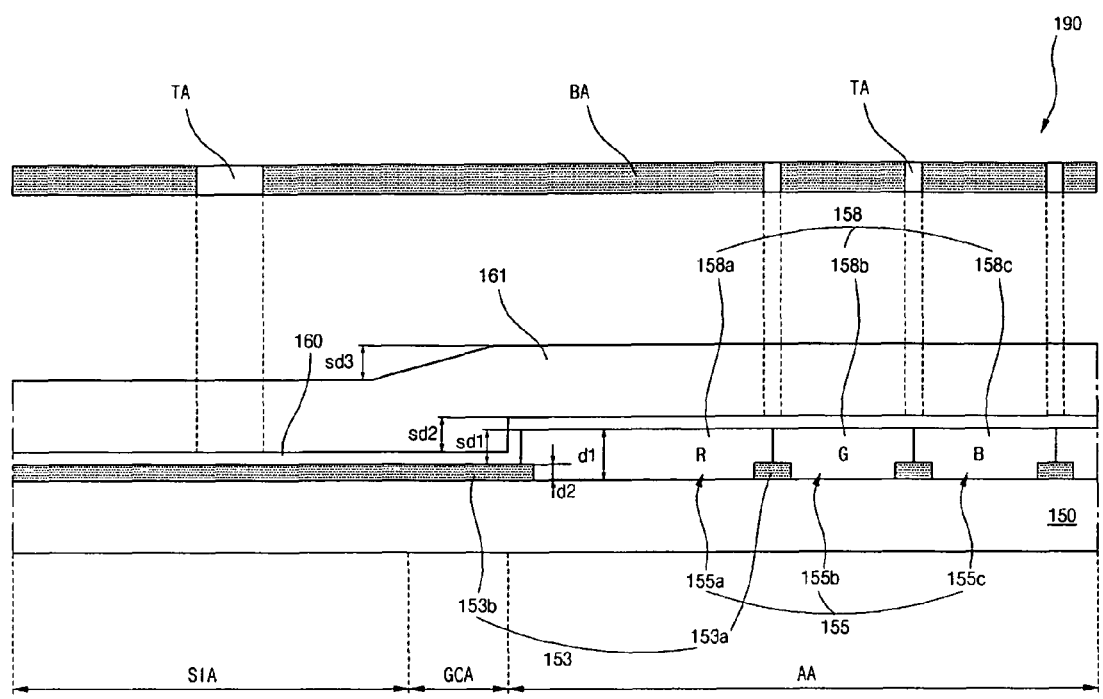

In FIG. 5E, an organic insulating layer 161 may be formed on the common electrode 160 by coating a photosensitive organic material such as photo acryl or photosensitive benzocyclobutene (BCB). For example, the organic insulating layer 161 may have a thickness within a range of about 2 μm to about 4 μm. Since the organic insulating layer 161 may be planarized, the organic insulating layer 161 has a third step difference "sd3" smaller than the second step difference "sd2" at the edge portions of the color filter layer 158. A mask 190 having a transmissive area "TA" and a blocking area "BA" is disposed over the organic insulating layer 161, and ultraviolet light may be irradiated onto the organic insulating layer 161 through the mask 190. When the organic insulating layer 161 is of positive type photosensitivity such that an irradiated portion remains after development, the mask 190 is disposed such that the transmissive area "TA" corresponds to the gate and data lines of the first substrate in the active area "AA" and the gate connection patterns of the first substrate in the signal input area "SIA" as shown in FIG. 5E. When the organic insulating layer 161 is of negative type photosensitivity such that an irradiated portion is removed after development, the mask 190 is disposed such that the blocking area "BA" corresponds to the gate and data lines of the first substrate in the active area "AA" and the gate connection patterns of the first substrate in the signal input area "SIA."

Figure 5F:
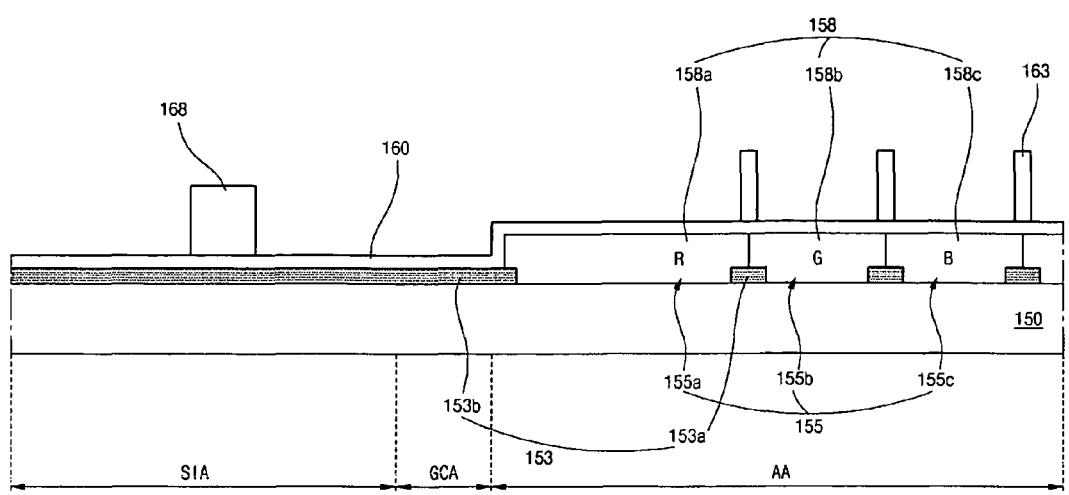

In FIG. 5F, patterned spacers 163 and shortage-preventing patterns 168 are formed by developing the irradiated organic insulating layer 161 (of FIG. 5F). The patterned spacers 163 are formed on the common electrode 160 over the first black matrix 153a, and the shortage-preventing patterns 168 are formed on the common electrode 160 over the second black matrix 153b. Each shortage-preventing pattern 168 may cover the gate connection pattern of the first substrate or may be disposed inside the gate connection pattern of the first substrate so that the conductive ball in the seal pattern can be spaced apart from the gate connection pattern. As a result, an electrical short between the gate connection pattern of the first substrate and the common electrode 160 of the second substrate through the conductive ball in the seal pattern is prevented even when the first and second substrates are attached.

In reference to FIG. 4, the seal pattern 180 is formed along a boundary portion of one of the first and second substrates 110 and 150 using a sealant including the conductive ball 175. The first substrate 110 having the TFT "Tr," the pixel electrode 143 and the gate connection pattern 144 is attached to the second substrate 150 having the common electrode 160, the patterned spacers 163 and the shortage-preventing patterns 168, and the liquid crystal layer 170 is formed between the first and second substrates 110 and 150. The patterned spacers 163 contact the passivation layer 138 of the first substrate 110 and the common electrode 160 of the second substrate 150 to keep the cell gap uniform. In addition, the shortage-preventing patterns 168 contact or are spaced apart from the gate connection pattern 144 to prevent the conductive ball 175 in the seal pattern 180 from contacting the gate connection pattern 144.

Consequently, in the GIP type LCD device according to the present invention, the shortage-preventing pattern is formed over the gate connection pattern so that an electrical short between the gate connection pattern and the common electrode through the conductive ball in the seal pattern can be prevented. In addition, since the shortage-preventing pattern is formed of the same material and on the same layer as the patterned spacer though the same process, an additional process for forming the shortage-preventing pattern is not required.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:
   forming first connection lines, second connection lines and a gate connection pattern on a first substrate including an active area, a signal input area and a pad area, wherein the signal input area and the pad area are disposed at a periphery of the active area, and the gate connection pattern contacting the first connection lines and the second connection lines in the signal input area;
   forming a common electrode on a second substrate;
   forming a shortage-preventing pattern, wherein the shortage-preventing pattern corresponds to the gate connection pattern;
   forming a seal pattern surrounding the active area, the seal pattern including a conductive ball;
   attaching the first and second substrates such that the shortage-preventing pattern faces the gate connection pattern; and
   forming a liquid crystal layer between the first and second substrates in the seal pattern.

2. The method according to claim 1, wherein said shortage preventing pattern is formed on the common electrode.

3. The method according to claim 1, wherein said shortage preventing pattern is formed on the gate connection pattern.

4. The device according to claim 1, wherein said shortage preventing pattern is made from a material selected from one of a dielectric, resin, plastic or glass.

5. The method according to claim 1, further comprising:
   forming a gate line on the first substrate in the active area;
   forming a gate insulating layer on the gate line and the first connection lines;
   forming a data line on the gate insulating layer in the active area, the data line crossing the gate line; and
   forming a passivation layer on the data line and the second connection lines, the passivation layer having a first contact hole exposing the first connection lines and the second connection lines.

6. The method according to claim 5, further comprising:
   forming a thin film transistor connected to the gate line and the data line; and
   forming a pixel electrode on the passivation layer and connected to the thin film transistor.

7. The method according to claim 6, wherein the thin film transistor includes a gate electrode, the gate insulating layer on the gate electrode, a semiconductor layer on the gate insulating layer, a source electrode on the semiconductor layer and a drain electrode spaced apart from the source electrode.

8. The method according to claim 6, wherein the gate connection pattern and the pixel electrode are simultaneously formed on the passivation layer.

9. The method according to claim 1, further comprising:
   forming a first black matrix and a second black matrix on the second substrate, the first black matrix corresponding to the active area and the second black matrix corresponding to the signal input area; and
   forming a color filter layer on the first black matrix.

10. The method according to claim 1, further comprising forming a patterned spacer on the common electrode corresponding to the active area.

11. The method according to claim 10, wherein the shortage-preventing pattern and the patterned spacer are simultaneously formed on the common electrode.

12. A shortage preventing structure for a liquid crystal display device comprising:
    a first height; and
    a second width different from a width of a gate connection pattern;
    wherein said shortage preventing structure is substantially disposed between a common electrode and said gate connection pattern,
    wherein said gate connection pattern is disposed within a perimeter of said shortage preventing structure, and
    wherein said shortage preventing structure is formed in a seal pattern including a conductive ball.

13. The shortage preventing structure of claim 12, wherein said shortage preventing structure is a material selected from one of a dielectric, resin, plastic or glass.

14. The shortage preventing structure of claim 12, wherein the first height is greater than a radius of the conductive ball.

* * * * *